(12) United States Patent
Huang et al.

(10) Patent No.: US 8,173,539 B1
(45) Date of Patent: May 8, 2012

(54) METHOD FOR FABRICATING METAL REDISTRIBUTION LAYER

(75) Inventors: Pei-Lin Huang, Taoyuan County (TW); Chun-Yen Huang, Taoyuan County (TW); Yuan-Yuan Lin, Taoyuan County (TW); Yu Shan Chiu, Taoyuan County (TW); Yi-Min Tseng, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/085,460

(22) Filed: Apr. 12, 2011

(51) Int. Cl.
*H01L 21/44* (2006.01)
(52) U.S. Cl. ............... 438/622; 438/638; 257/E21.585
(58) Field of Classification Search .................. 438/599; 257/E21.536
See application file for complete search history.

(56) References Cited

U.S. PATENT DOCUMENTS

2011/0104888 A1* 5/2011 Kim et al. ............. 438/637

* cited by examiner

*Primary Examiner* — Cheung Lee

(57) ABSTRACT

A method for fabricating a metal redistribution layer is described. A first opening and a second opening are formed in a dielectric layer over a first region and a second region thereof, respectively. A plurality of third openings are formed in the dielectric layer exposed by the first opening in the first region and a plurality of fourth openings are formed in the dielectric layer exposed by the second opening in the second region. A metal material is formed over the dielectric layer and in the first, second, third and fourth openings. A plurality of recesses is formed in the metal materials overlying the third and fourth openings. The metal material in the first region is patterned by using the recesses formed in portions of the metal material overlying the fourth openings in the second region as an alignment mark to form a metal redistribution layer.

10 Claims, 11 Drawing Sheets

METHOD FOR FABRICATING METAL REDISTRIBUTION LAYER

BACKGROUND OF THE INVENTION

1. Field of the Invention

The present invention relates to semiconductor fabrication, and in particular relates to a method for fabricating a metal redistribution layer.

2. Description of the Related Art

Historically, integrated circuits have been formed on surfaces of silicon substrates with conductive pads formed at peripheries thereof. Generally, wire bonds are attached to the conductive pads which provide electrical connections from the conductive pads to pads on a package substrate.

Increasing complexity of electronic circuitry of integrated circuits has required an increase in the number of input and output connections to integrated circuits. The increase in the input and the output connections has required input and output conductive pads to be formed more closely together. That is, the pitch between the conductive pads which are used as input and the output connections to the integrated circuits has decreased with increased circuit complexity.

Therefore, locating the conductive pads at the interior of the silicon substrate surface rather than the periphery allows the conductive pads to be physically spaced further apart. However, many integrated circuit designs exist in which the conductive pads are located at the periphery of the silicon substrate. The expense to retool the design process of the integrated circuit so that the conductive pads are located at the interior of the silicon substrate surface can be very large. That is, redesigning the integrated circuit so that the conductive pads are located at the interior of the silicon substrate surface can be prohibitively expensive.

It is desirable to have a method for forming a metal redistribution layer over an integrated circuit for interconnecting conductive pads located at the interior thereof with conductive pads located at the periphery thereof.

BRIEF SUMMARY OF THE INVENTION

Methods for fabricating a metal redistribution layer are provided.

An exemplary method for fabricating a metal redistribution layer comprises providing a semiconductor structure with a dielectric layer formed thereon. A first opening and a second opening are formed in the dielectric layer over a first region and a second region thereof, respectively, wherein the second region is outside of the first region. A plurality of third openings are formed in the dielectric layer exposed by the first opening in the first region and a plurality of fourth openings are formed in portions of the dielectric layer exposed by the second opening in the second region. A metal material is formed over the dielectric layer and in the first, second, third and fourth openings, wherein the metal material fills the third and fourth openings, and substantially fills the first and second openings, and a plurality of recesses are formed in the metal materials overlying the third and fourth openings. The metal material in the first region is patterned by using the recesses formed in portions of the metal material overlying the fourth openings in the second region as an alignment mark to form a metal redistribution layer over the dielectric layer and in the first and third openings in the first region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
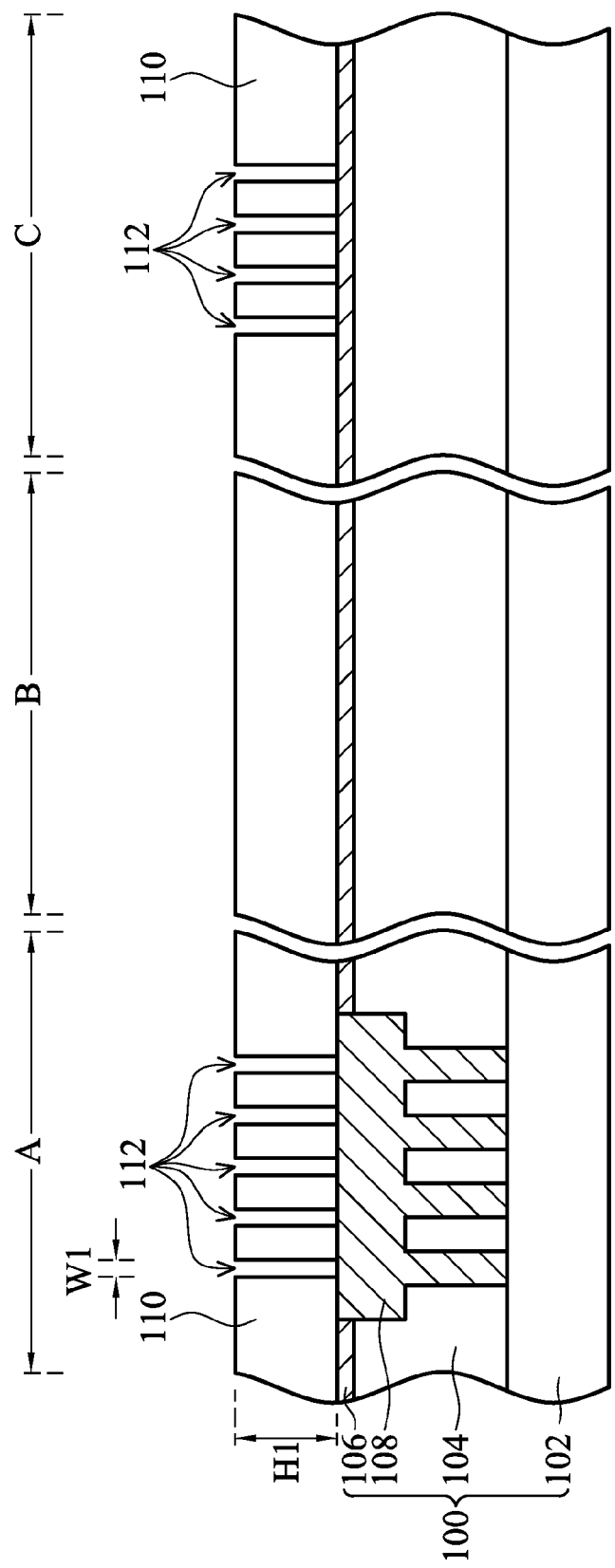
Figure 3:
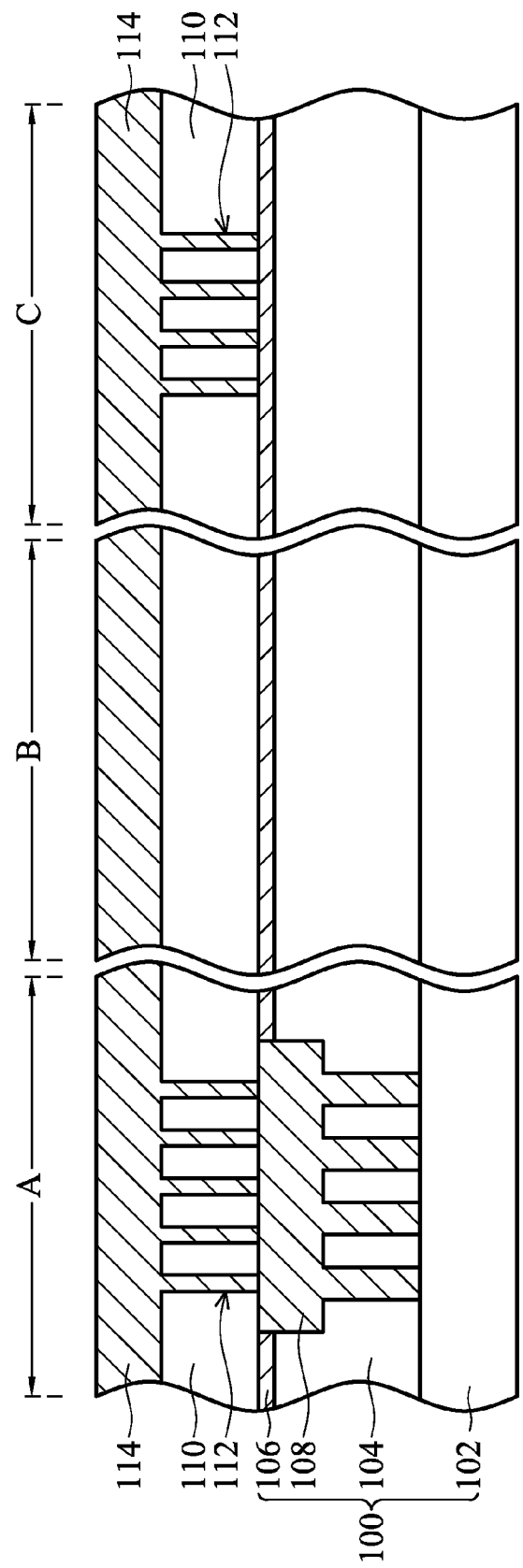
Figure 4:
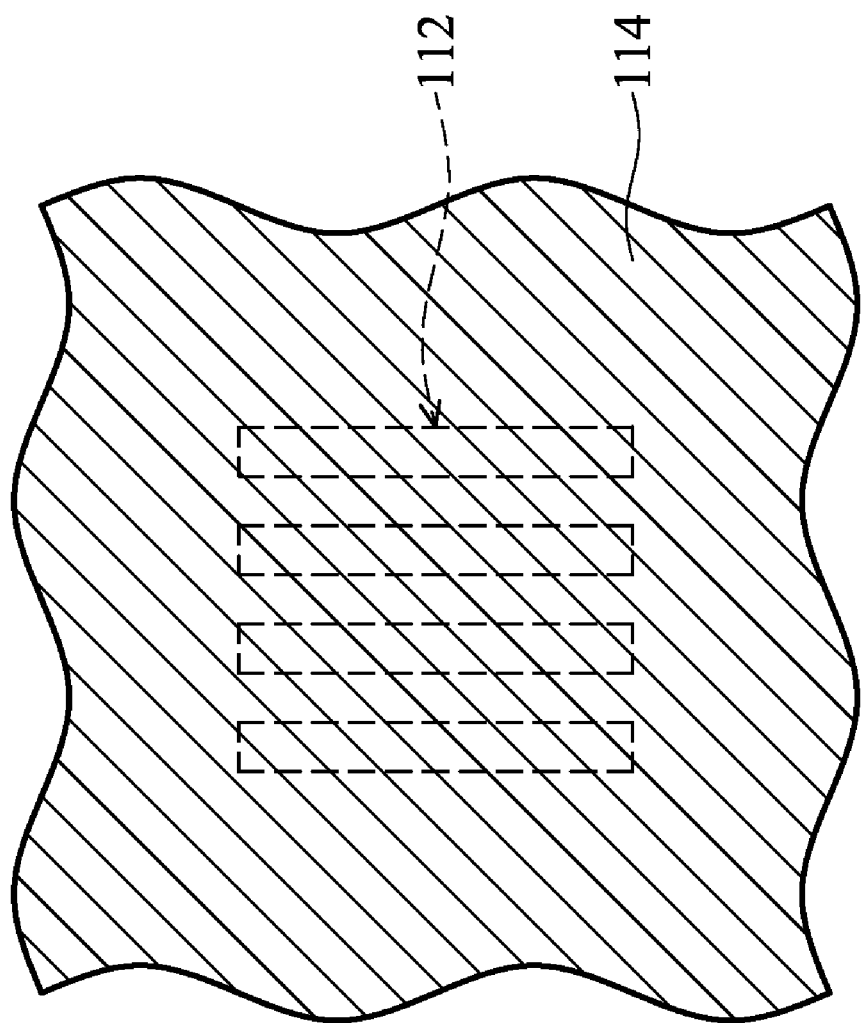

FIGS. 1-5 are schematic diagrams showing an exemplary method for fabricating a metal redistribution layer. FIGS. 1-3 and 5 are schematic cross sections and FIG. 4 is a schematic top view. Herein, the exemplary method is a method known by the inventors and is used as a comparative example to comment on the problems found by the inventors, but is not used to restrict the scope of the invention.

Figure 1:
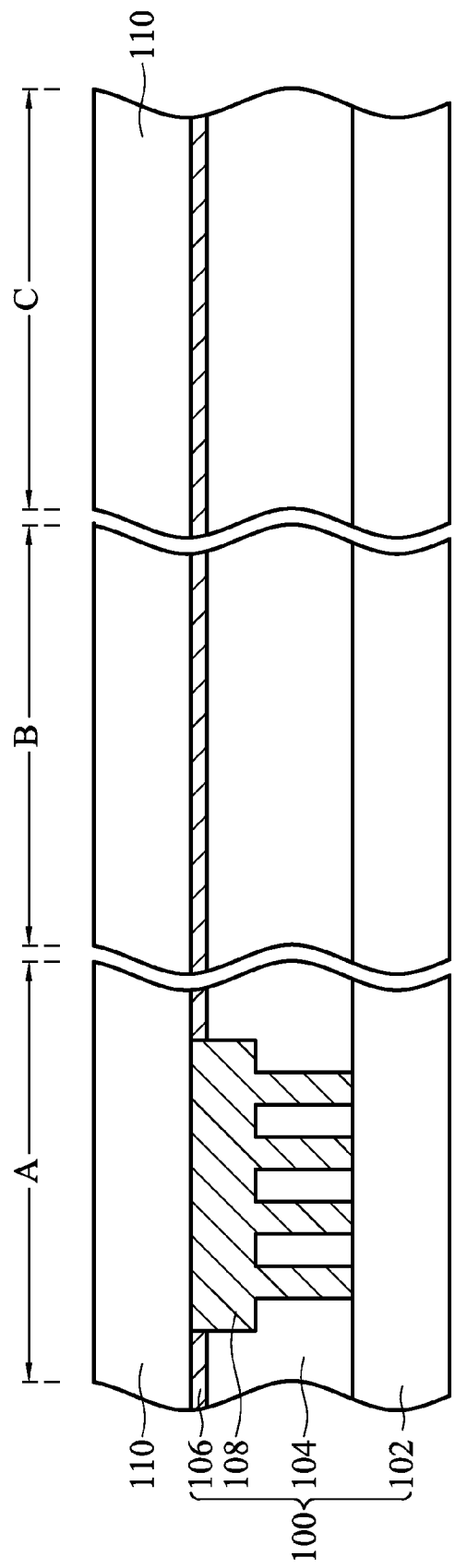
FIGS. 1-5 are schematic diagrams showing a method for fabricating a metal redistribution layer according to an embodiment of the invention.

In FIG. 1, a semiconductor structure 100 is first provided. The semiconductor structure 100 comprises a semiconductor substrate (not shown) with dielectric layers 102 and 104, and an etching stop layer 106 sequentially formed thereover. Herein, the semiconductor structure 100 is defined with three individual regions A, B, and C. The region A of the semiconductor structure 100 can be, for example, an interior array region with active and/or passive devices and other conductive components (both not shown) formed therein. The region B of the semiconductor structure 100 can be, for example, an outer periphery region adjacent to the region A. The region C of the semiconductor structure 100 can be, for example, a further outer scribe line region adjacent to the region B for die sawing. Thus, a conductive interconnect 108 is formed through a portion of the etching stop layer 106 and the dielectric layer 104 in the region A, and a top surface of the conductive interconnect 108 is exposed. The conductive interconnect 108 may electrically contact with, for example, the active and/or passive devices (not shown), and other components (not shown) in the region A of the semiconductor structure 100.

Next, a dielectric layer 110 is blanketly formed over the semiconductor structure 100 to cover the conductive interconnect 108 and the etching stop layer 106 in the regions A, B and C. The dielectric layer 110 can be, for example, a silicon oxide of a thickness of about 7000-17000 Å. The silicon oxide of the dielectric layer 110 can be formed by a method such as plasma enhanced chemical vapor deposition (PECVD).

In FIG. 2, the dielectric layer 110 in the regions A and C are then patterned by conventional photolithography and etching processes (both not shown) to respectively form a plurality of openings 112 in the dielectric layer 110 in the regions A and C. The openings 112 in the region A are formed through the dielectric layer 110 overlying the conductive interconnect 108, thereby respectively exposing a portion of the conductive interconnect 108 thereunder. The openings 112 in the region C are formed through the dielectric layer 110 overlying the etching stop layer 106, thereby respectively exposing a portion of the etching stop layer 106 thereunder. As shown in FIG. 2, the openings 112 formed in the regions A and C are formed with a depth H1 which are the same as the thickness of the dielectric layer 110 and a width W1 of about 4000-17000 Å, thereby having an aspect ratio (H1/W1) of about 0.7-2.

In FIG. 3, a metal material 114 is then blanketly deposited over the dielectric layer 110 and in the openings 112. For the purpose of electrical connections, the metal material 114 entirely fills the openings 112 to physically contact with the underlying conductive interconnect 108, wherein no voids or seams are formed in the openings 112. In one embodiment, the metal material 114 can be aluminum-containing material such as AlCu and is formed by a process such as sputtering. The aspect ratio of the openings 112 is relative high, such that a temperature and a power used in the sputtering process for forming the aluminum-containing material of the metal material 114 are elevated to about 420-480° C. and about 9000-15000 W to entirely fill the openings 112 without forming voids and seams formed therein. Therefore, the aluminum-containing material of the metal material 114 is thermally reflowable during the sputtering process and entirely fills the openings 112 without forming voids and seams therein. As shown in FIG. 3, the metal material 114, however, is formed with a planar top surface at a place over the openings 112 in the regions A and C after formation thereof by the above disclosed sputtering process. It is undesired to make the metal material 114 have such a planar top surface at the place over the openings 112 since the metal material 114 formed over the openings 112 in the region C functions as an alignment mark for patterning the metal material 114.

FIG. 4 shows a schematic top view of a portion of the region C near the openings 112 as illustrated in FIG. 3. In one embodiment, the openings 112 formed in the dielectric layer 110 in the regions C are first formed in parallel isolated line patterns and then the metal material 114 is formed over the dielectric layer 110 (see FIG. 3) to fill the openings 112 by the above described method such that the planar top surfaces are above the openings. The planar top surface is undesired and a concave top surface is preferred to be formed over the openings 112 for functioning as an alignment mark for sequential patterning process of the metal material 114. Once the metal material 114 formed over the openings 112 in the region C is formed with a planar top surface, an alignment mark for sequential patterning process of the metal material 114 would not be found by a photolithography tool used in sequential photolithography process, thereby affecting patterning of the metal material 114.

Figure 5:
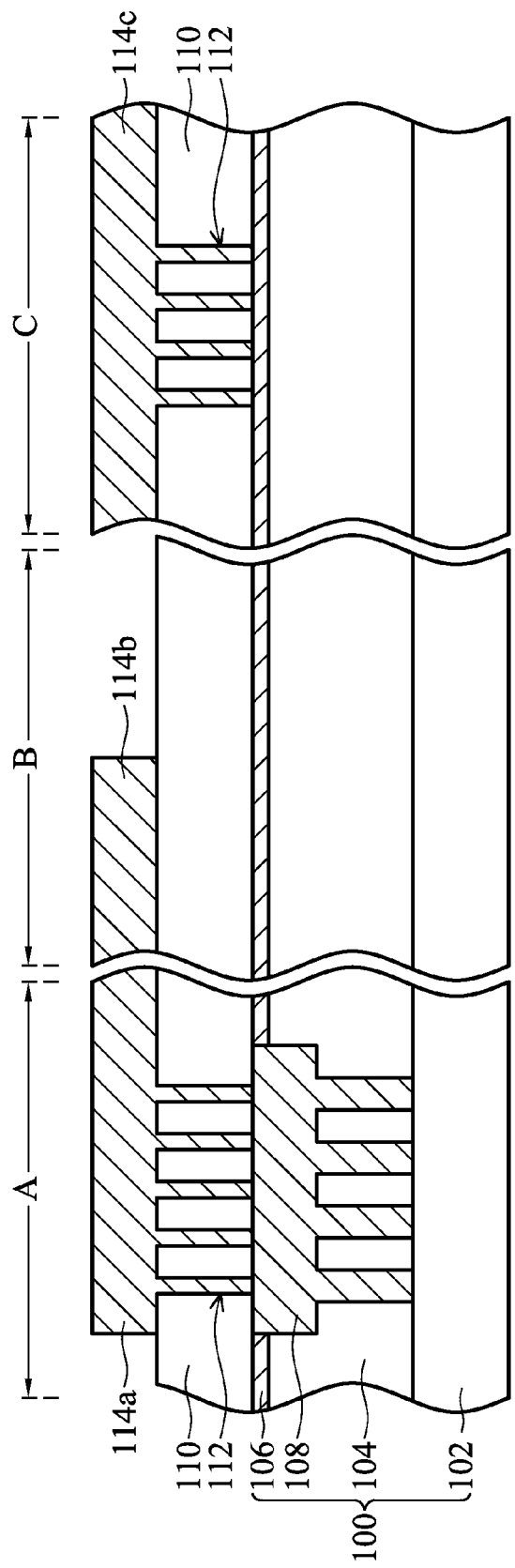

FIG. 5 shows an imaginary cross section after an ideal patterning process of the metal material 114. After the ideal patterning process, a redistribution layer 114a is formed on and through the dielectric layer 110 in the region A and a portion of the redistribution layer 114a physically connecting to the underlying conductive interconnect 108 also function as an interior conductive pad. An outer conductive pad 114b is formed on the dielectric layer 110 in the region B for sequential wire or bump bonding and the conductive pad 114b is physically connected with the redistribution layer 114a. An unpatterned metal material 114c is left over the dielectric layer 110 in the region C.

Thus, there's a need for an improved method for fabricating a metal redistribution layer for addressing the unclear alignment mark issue as described above.

FIGS. 6-11 are schematic diagrams showing another exemplary method for fabricating a pad redistribution layer which addresses the unclear alignment mark issue as described above.

Figure 6:
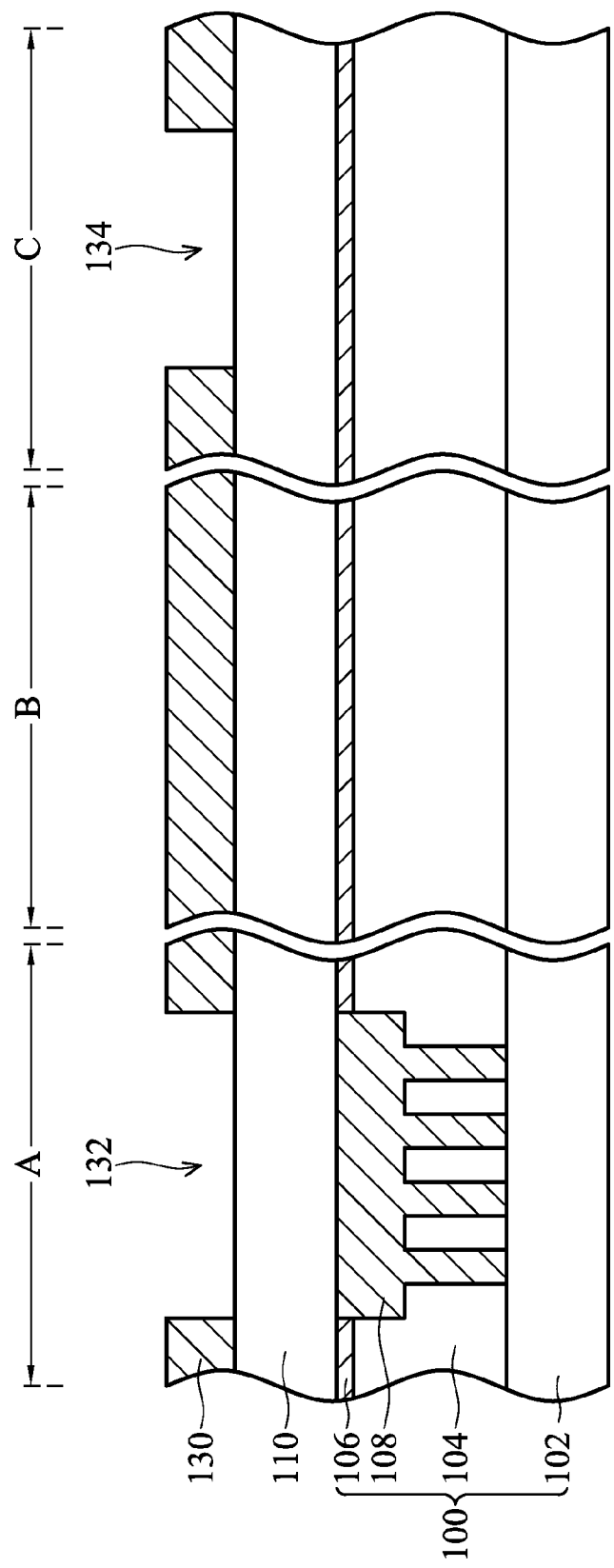
FIGS. 6-11 are schematic diagrams showing a method for fabricating a metal redistribution layer according to another embodiment of the invention.

In FIG. 6, the semiconductor structure 100 with the dielectric layer 110 formed thereover as that illustrated in FIG. 1 is first provided. The semiconductor structure 100 in FIG. 6 comprises same components as that disclosed in FIG. 1, and the same reference numbers represent the same components as that illustrated in FIG. 1.

Next, a mask layer, for example, a photoresist layer is formed over the dielectric layer 110 and is then pattered to form an opening 132 in a portion thereof in the region A and an opening 134 in a portion thereof in the region C, thereby leaving a patterned mask layer 130 over the dielectric layer 110 with openings 132 and 134 partially exposing a portion of the dielectric layer 110 in the regions A and C therein. The opening 132 in the region A is substantially located at a place over the conductive interconnect 108.

Figure 7:
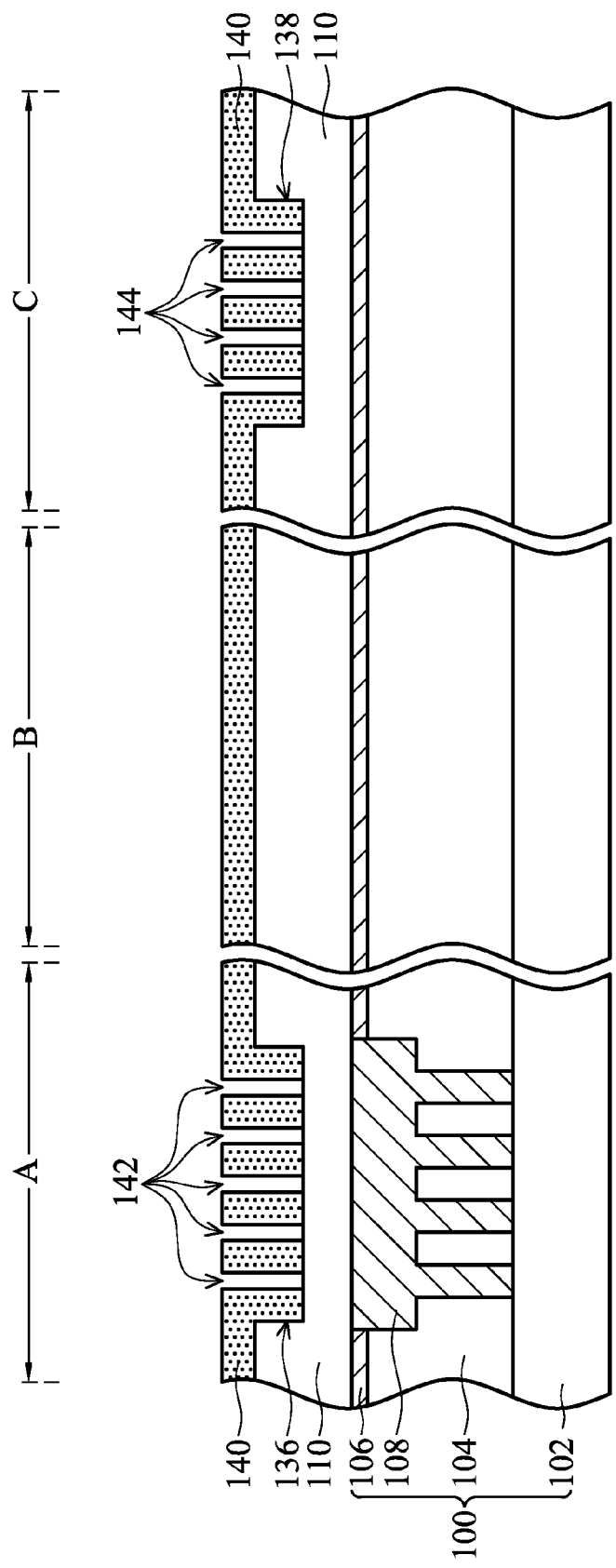

In FIG. 7, an etching process (not shown) is performed, using the patterned mask layer 130 as an etching mask, to etch away a portion of the dielectric layer 110, thereby forming an opening 136 in the dielectric layer 130 in the region A and an opening 138 in the dielectric layer 110 in the region C. The openings 136 and 138 can be, for example, trench openings and a portion of the dielectric layer 110 formed with a reduced thickness of about 2000-5000 Å is respectively exposed by the openings 136 and 138 formed in the regions A and C.

Next, the patterned mask layer 130 (see FIG. 6) is removed and another mask layer, for example, a photoresist layer is formed over the dielectric layer 110 and in the openings 136 and 138, and is then patterned to form a plurality of openings 142 and 144 therein, thereby leaving a patterned mask layer 140 over the dielectric layer 110 with openings 142 and 144 partially exposing a portion of the dielectric layer 110 in the regions A and C, respectively. The plurality of openings 142 are formed in the portion of the patterned mask layer 140 formed in the opening 136 in the region A, thereby exposing the portion of the dielectric layer 110 with the reduced thickness. The plurality of openings 144 are formed in the portion of the patterned mask layer 140 formed in the opening 138 in the region C, thereby exposing the portion of the dielectric layer 110 with the reduced thickness.

Figure 8:
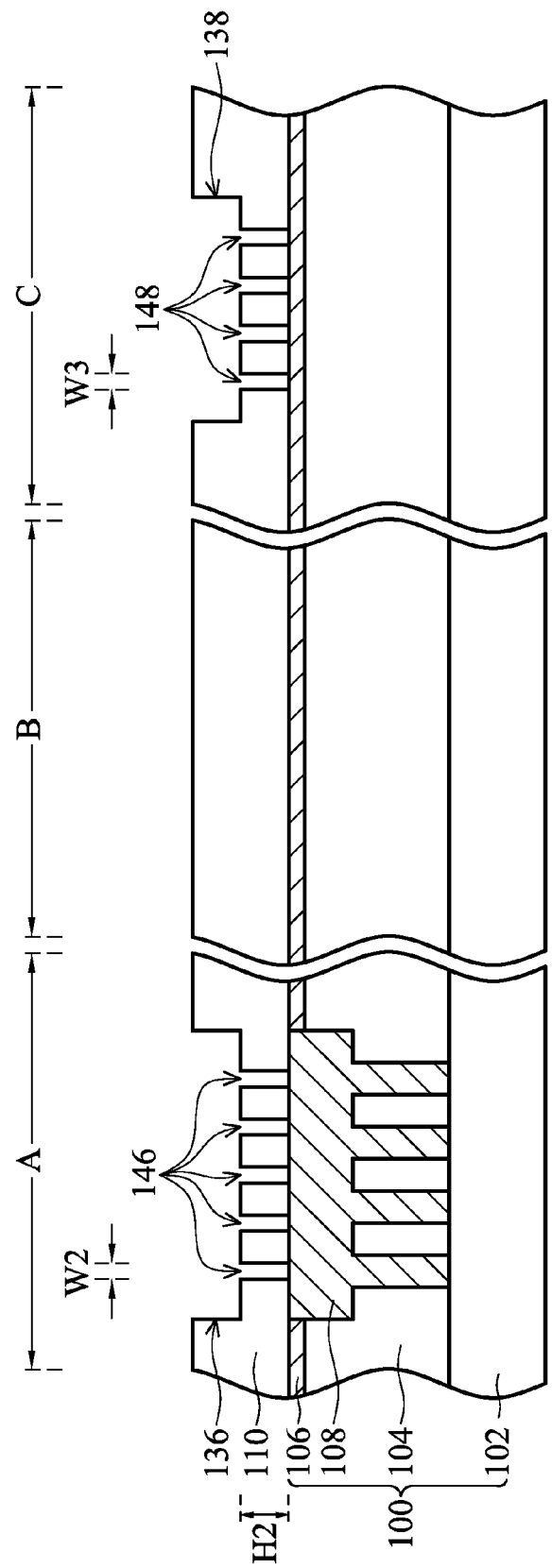

In FIG. 8, an etching process (not shown) is performed, using the patterned mask layer 140 (see FIG. 7) as an etching mask, to etch away a portion of the dielectric layer 110 exposed by the openings 142 and 144, thereby forming a plurality of opening 146 and 148 in the dielectric layer 110 of the regions A and C, respectively. The openings 146 and 148 can be, for example, contact openings. Next, the patterned mask layer 140 (see FIG. 7) is removed. Herein, the openings 146 formed in the dielectric layer 110 in the region A are formed with a depth H2 of about 2000-5000 Å and a width W2 of about 4000-17000 Å, thereby having an aspect ratio (H2/W2) of about 0.2-0.5, and the openings 148 formed in the region C are formed with the same depth H2 and a width W3 of about 20-1 μm, thereby having an aspect ratio (H2/W3) of about 0.01-0.5, depending to various align mark designs. As shown in FIG. 8, the openings 146 formed in the region A respectively exposes a portion of the conductive interconnect 108 thereunder, and the openings 148 formed in the region C respectively exposes a potion of the etching stop layer 106 thereunder.

Figure 9:
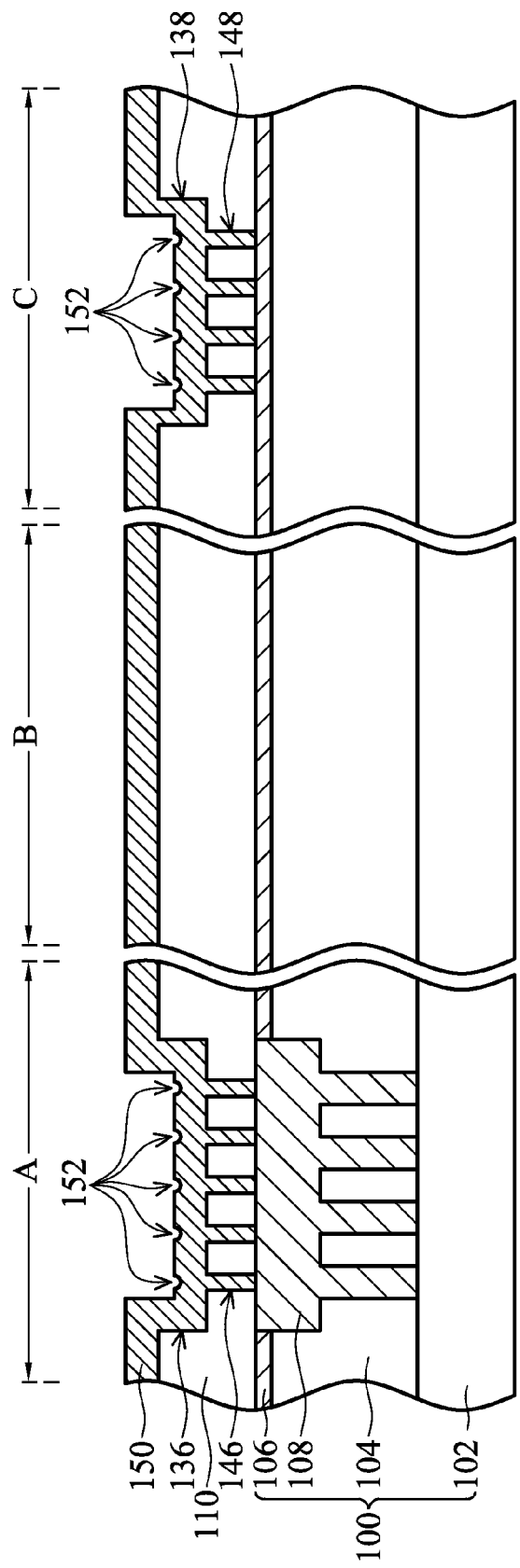

In FIG. 9, a metal material 150 is next deposited over the dielectric layer 110 and in the openings 136, 138, 146, and 148. For the purpose of electrical connections, the metal material 150 entirely fills the openings 146 to physically contact with the underlying conductive interconnect 108, wherein no voids or seams are formed in the openings 146 and 148. In one embodiment, the metal material 150 can be aluminum-containing material such as AlCu and is formed by a method such as a sputtering process. The aspect ratio of the openings 146 and 148 is relatively low when compared with that of the openings 112 shown in FIG. 2, such that a temperature and a power used in the sputtering for forming the aluminum-containing material of the metal material 150 can be lower to about 380-420° C. and about 5000-8000 W to entirely fill the openings 146 and 148 without formations of voids or seams therein. In addition, the metal material 150 partially fills the openings 136 and 138, and does not entirely fill them as shown in FIG. 3. Therefore, the metal material 150 is now formed with a nonplanar top surface at a place over the openings 146 in the region A and over the openings 148 in the region C. Recesses 152 are formed in the top surface of the metal material 150 at the place over the openings 146 in the region A and at the place over the openings 148 in the region C.

Figure 10:
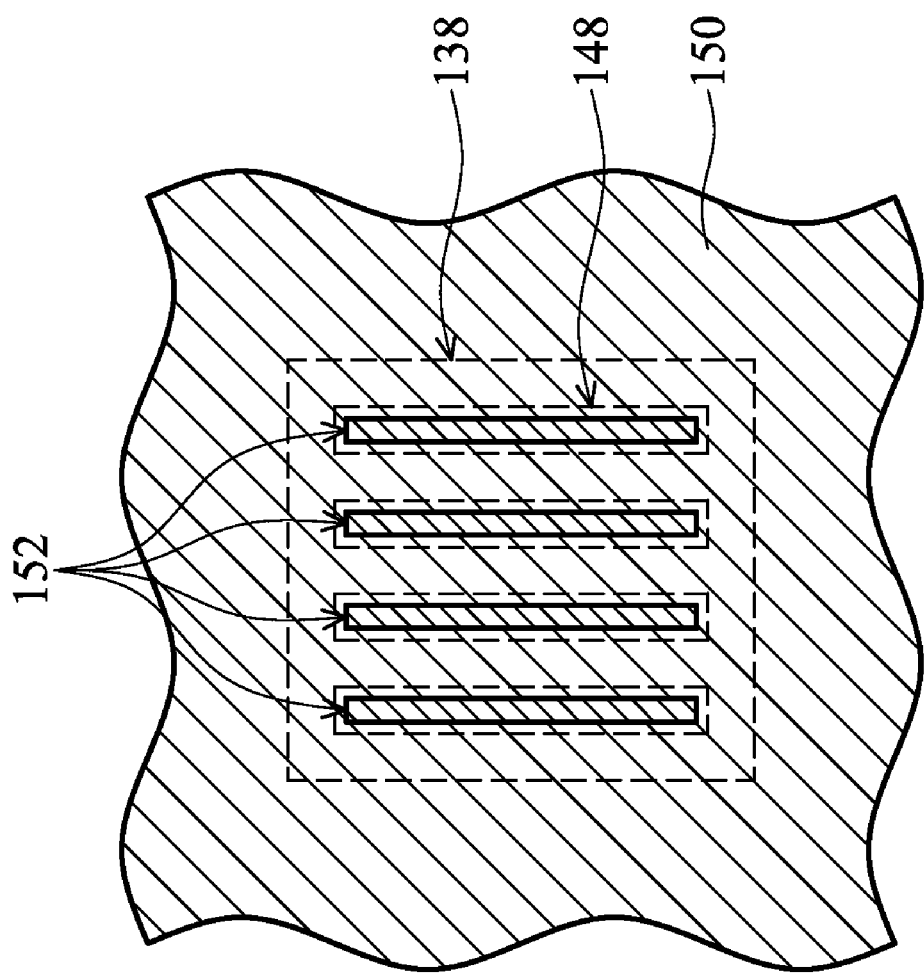

FIG. 10 shows a schematic top view of a portion of the region C adjacent to the openings 148 as illustrated in FIG. 9. In one embodiment, the openings 148 formed in the dielectric layer 110 (see FIG. 9) in the regions C are formed in parallel isolated line patterns and then the metal material 150 is formed over the dielectric layer 110 (see FIG. 9) and fills the openings 138 and 148 by the above described method, such that a non-planar top surface is formed above the openings 148. Thus, the non-planar top surface is desired and a top surface with recesses 152 formed over the openings 148 may function as an alignment mark for sequential patterning of the metal material 150.

Figure 11:
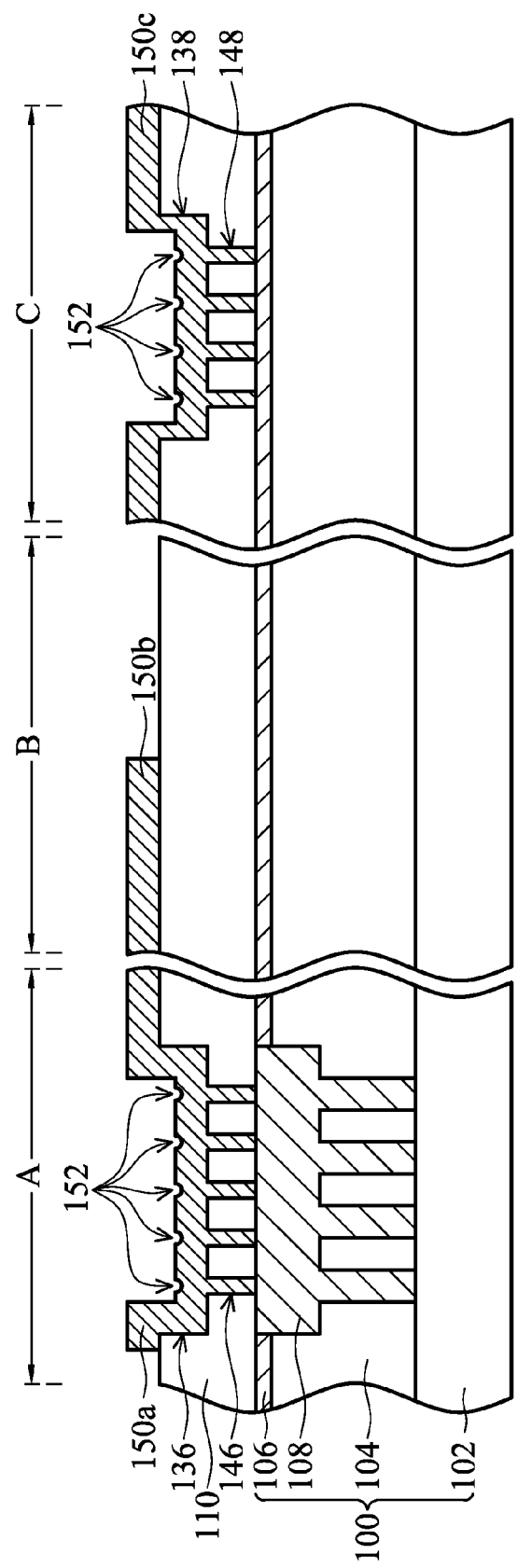

In FIG. 11 the metal material 150 is then patterned by conventional photolithography and etching processes (both not shown) by using the above described alignment marks shown in the region C. After the patterning process of the metal material 150 is completed, a redistribution layer 150a is formed on and through the dielectric layer 110 in the region A and a portion of the redistribution layer 150a physically connecting to the underlying conductive interconnect 108 also functions as an interior conductive pad. An outer conductive pad 150b is formed on the dielectric layer 110 in the region B for sequential wire or bump bonding process and the conductive pad 150b is physically connected with the redistribution layer 150a. An unpatterned metal material 150c with recesses 152 formed on portions thereof is left over the dielectric layer 110 in the region C.

Therefore, the exemplary method for fabricating a metal redistribution layer as disclosed in FIGS. 6-11, providing a clear alignment mark in the region C, for example, a scribe line region, such that a photolithography tool used in a sequential photolithography process may clearly find the alignment mark in the region C. Thus, patterning the metal material 150 for forming the metal redistribution layer can be ensured.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a metal redistribution layer, comprising:
    providing a semiconductor structure with a dielectric layer formed thereon;
    forming a first opening and a second opening in the dielectric layer over a first region and a second region thereof, respectively, wherein the second region is outside of the first region;
    forming a plurality of third openings in the dielectric layer exposed by the first opening in the first region and a plurality of fourth openings in portions of the dielectric layer exposed by the second opening in the second region;
    forming a metal material over the dielectric layer and in the first, second, third and fourth openings, wherein the metal material fills the third and fourth openings, and substantially fills the first and second openings, and a plurality of recesses are formed in the metal material overlying the third and fourth openings; and
    patterning the metal material in the first region by using the recesses formed in the metal material overlying the fourth openings in the second region as an alignment mark, forming a metal redistribution layer over the dielectric layer and in the first and third openings in the first region.

2. The method as claimed in claim 1, wherein the metal material comprises aluminum-containing material.

3. The method as claimed in claim 2, wherein the aluminum-containing material is formed by a sputtering process performed under a temperature of about 380-420° C.

4. The method as claimed in claim 1, wherein the third openings have an aspect ratio of about 0.2-0.5.

5. The method as claimed in claim 1, wherein the fourth openings have an aspect ratio of about 0.01-0.5.

6. The method as claimed in claim 1, wherein the dielectric layer exposed by the first and second openings has a thickness of about 2000-5000 Å.

7. The method as claimed in claim 1, wherein the semiconductor structure comprises a conductive interconnect and the metal redistribution layer formed in the dielectric layer of the first region physically contacts with the conductive interconnect.

8. The method as claimed in claim 1, wherein the first region is an array region.

9. The method as claimed in claim 1, wherein the second region is a scribe line region.

10. The method as claimed in claim 1, wherein the third and fourth openings are formed as parallel isolated line patterns.

* * * * *